United States Patent
Oohata et al.

(10) Patent No.: US 7,697,267 B2
(45) Date of Patent: Apr. 13, 2010

(54) CAPACITOR AND METHOD FOR MANUFACTURING SAME

(75) Inventors: Hideki Oohata, Tokyo (JP); Akihiko Shirakawa, Chiba (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/159,699

(22) PCT Filed: Dec. 27, 2006

(86) PCT No.: PCT/JP2006/326092

§ 371 (c)(1),
(2), (4) Date: Aug. 29, 2008

(87) PCT Pub. No.: WO2007/077883

PCT Pub. Date: Jul. 12, 2007

(65) Prior Publication Data

US 2008/0316681 A1 Dec. 25, 2008

(30) Foreign Application Priority Data

Dec. 28, 2005 (JP) .............................. 2005-377040

(51) Int. Cl.
*H01G 9/00* (2006.01)
(52) U.S. Cl. ...................... 361/523; 361/525; 361/528; 361/529; 361/516; 361/519; 29/25.01; 29/25.03
(58) Field of Classification Search .............. 361/523, 361/525–529, 516–519, 540–541; 29/25.01, 29/25.03
See application file for complete search history.

(56) References Cited

U.S. PATENT DOCUMENTS

| 4,590,541 | A | * | 5/1986 | Takahashi et al. ............ 361/527 |
| 5,328,718 | A | | 7/1994 | Abe et al. |
| 6,151,205 | A | * | 11/2000 | Kobayashi et al. .......... 361/523 |
| 6,210,450 | B1 | * | 4/2001 | Fukaumi et al. ............ 29/25.03 |
| 6,219,223 | B1 | * | 4/2001 | Kobayashi et al. .......... 361/525 |
| 7,139,162 | B2 | * | 11/2006 | Michel et al. ............... 361/508 |
| 7,256,982 | B2 | * | 8/2007 | Lessner et al. .............. 361/516 |
| 7,326,261 | B2 | * | 2/2008 | Nagasawa et al. .......... 29/25.03 |
| 7,379,290 | B2 | * | 5/2008 | Toida et al. ................. 361/523 |
| 2004/0238848 | A1 | * | 12/2004 | Arai ........................... 257/202 |

FOREIGN PATENT DOCUMENTS

| EP | 1 445 348 A1 | 8/2004 |
| JP | 60-116119 A | 6/1985 |
| JP | 61-030678 A | 2/1986 |
| JP | 61-064112 A | 4/1986 |
| JP | 04-111408 A | 4/1992 |
| JP | 05-124817 A | 5/1993 |
| JP | 05-315197 A | 11/1993 |
| JP | 11-172489 A | 6/1999 |
| JP | 2003-146659 A | 5/2003 |
| JP | 2003-146689 A | 5/2003 |
| JP | 2003-206135 A | 7/2003 |

* cited by examiner

*Primary Examiner*—Nguyen T Ha
(74) *Attorney, Agent, or Firm*—Sughrue Mion, PLLC

(57) ABSTRACT

The present invention relates to a capacitor having high capacitance, low ESR (equivalent series resistance) in a high-frequency region and low leakage current, including a composite oxide film obtained by reaction of an oxide film obtained by subjecting the surface of the substrate comprising valve-acting metal element to electrolytic oxidation with a solution in which metal ion and an organic base are dissolved and by subsequently sintering the reactant, a solid electrolyte formed on the composite oxide film and a conductor layer formed thereon; a method for producing the same and electronic devices using the same.

15 Claims, No Drawings

CAPACITOR AND METHOD FOR MANUFACTURING SAME

CROSS REFERENCE TO RELATED APPLICATION

This application is a National Stage of International Application No. PCT/JP2006/326092 filed on Dec. 27, 2006, claiming priority based on Japanese Patent Application No. 2005-377040, filed Dec. 28, 2005, the contents of all of which are incorporated herein by reference in their entirety.

TECHNICAL FIELD

The present invention relates to a capacitor and a producing method thereof. Specifically, the invention relates to a capacitor having high capacitance, low ESR (equivalent series resistance) in a high-frequency region and low leakage current, and a producing method thereof.

BACKGROUND ART

Along with the performance enhancement of the recent electronic devices such as downsizing and digitalization in higher frequency, there has been growing demand for electronic components, particularly on capacitors, having higher capacitance, low ESR (equivalent series resistance) in a high-frequency region and low leakage current.

Since the capacitance is proportional to the relative dielectric constant and inversely proportional to the thickness of the dielectric layer, it has been demanded to uniformly form a thin dielectric layer having high relative dielectric constant.

With respect to a film formation method of a dielectric layer, there are a dry forming method and a wet forming method. A dry film-forming method includes a film-forming method such as sputtering, a CVD method and vacuum evaporation. In a dry film-forming method, there is a concern of high facility and equipment costs to maintain high-vacuum state, to introduce expensive film-formation equipment, etc. Also, it is difficult to form a film uniformly on a porous substance having a complicated shape due to the presence of concavity and convexity, and therefore the difficulties in controlling the thickness and composition of the film are often pointed out.

As wet film-forming methods, Japanese Patent Application Laid-Open No. S60-116119 (Patent Document 1) and No. S61-30678 (Patent Document 2) disclose technique for forming a thin film of barium titanate by chemically forming a metal titanium substrate in a strong alkali solution containing barium ions. Japanese Patent Application Laid-Open No. H05-124817 (Patent Document 3: related application: U.S. Pat. No. 5,328,718) discloses a technique for forming a thin film of barium titanate on a substrate by alkoxide method.

Japanese Patent Application Laid-Open No. 2003-206135 (Patent Document 4: related application: EP 1445348) discloses a technique for forming a composite titanium oxide film, in which a metal titanium substrate is treated in an aqueous solution of alkali metal to thereby form a titanate of alkali metal on the substrate surface and is further treated in an aqueous solution containing metal ions such as ions of strontium and calcium to thereby substitute the alkali metal with metals such as strontium and calcium. Further, Japanese Patent Application Laid-Open No. H11-172489 (Patent Document 5) discloses a method for producing a barium titanate film by forming a titanium oxide film on a substrate by electrochemical approach and then subjecting the film to anodic oxidation in a barium aqueous solution.

[Patent Document 1]

Japanese Patent Application Laid-Open No. S60-116119

[Patent Document 2]

Japanese Patent Application Laid-Open No. S61-30678

[Patent Document 3]

Japanese Patent Application Laid-Open No. H05-124817

[Patent Document 4]

Japanese Patent Application Laid-Open No. 2003-206135

[Patent Document 5]

Japanese Patent Application Laid-Open No. H11-172489

DISCLOSURE OF THE INVENTION

Problems to be Solved by the Invention

An objective of the present invention is to provide a capacitor having high capacitance, low ESR (equivalent series resistance) in a high-frequency region and low leakage current; a method for producing the same; and electronic devices using the same.

Means to Solve the Problem

As a result of intensive studies to solve the problem, the present inventors have found that a small-size capacitor having a high capacitance, low ESR and low leakage current can be attained by using a composite oxide film obtained from the material of an oxide film obtained by subjecting valve-acting metal material to electrolytic oxidation. The present invention has been completed based on this finding.

The present invention relates to the following:

1. A capacitor comprising a composite oxide film obtained by reaction of an oxide film obtained by subjecting the surface of the substrate comprising valve-acting metal element to electrolytic oxidation with a solution in which metal ion and an organic base are dissolved.

2. A capacitor comprising a composite oxide film obtained by reaction of an oxide film obtained by subjecting the surface of the substrate comprising valve-acting metal element to electrolytic oxidation with a solution in which metal ion and an organic base are dissolved and by subsequently sintering the reactant.

3. A solid electrolytic capacitor comprising:

a substrate comprising a valve-acting metal element;

a composite oxide film obtained by reaction of an oxide film obtained by subjecting the surface of the substrate comprising valve-acting metal element to electrolytic oxidation with a solution in which metal ion and an organic base are dissolved;

a solid electrolyte layer laminated on the composite oxide film; and a conductor layer laminated on the solid electrolyte layer.

4. The capacitor described in any one of 1 to 3 above, wherein the reaction of the oxide film and the solution in which metal ion and organic base are dissolved uses a chemical reaction performed in the absence of an electric field.

5. The capacitor described in any one of 1 to 4 above, wherein the pH of the solution wherein metal ion and organic base are dissolved is 11 or more.

6. The capacitor described in any one of 1 to 5 above, wherein the relative dielectric constant of the composite oxide film is 80 to 15,000.

7. The capacitor described in any one of 1 to 6 above, wherein the thickness of the composite oxide film is 1 nm to 4000 nm.

8. The capacitor described in any one of 1 to 7 above, wherein the valve-acting metal element is titanium.

9. The capacitor described in any one of 1 to 8 above, wherein the metal ion is barium ion.

10. An electronic component using the capacitor described in any one of 1 to 9 above.

11. A printed circuit using the capacitor described in any one of 1 to 9 above.

12. A consumer electronic device using the capacitor described in any one of 1 to 9 above.

13. A method for producing a capacitor comprising at least a step of forming an oxide film by electrolytic oxidation of a valve-acting metal element and a step of reacting the oxide film with metal ion dissolved in an organic solvent.

14. A method for producing a capacitor comprising at least a step of forming an oxide film by electrolytic oxidation of a valve-acting metal element, a step of reacting the oxide film with a solution in which metal ion and organic base are dissolved and a step of sintering the reactant.

15. A method for producing a capacitor comprising at least a step of forming an oxide film by electrolytic oxidation of a valve-acting metal element, a step of reacting the oxide film with a solution in which metal ion and organic base are dissolved, a step of laminating a solid electrolyte layer on the composite oxide film and a step of laminating a conductor layer on the solid electrolyte layer.

EFFECTS OF THE INVENTION

The present invention enables to obtain a composite oxide film having high relative dielectric constant by reacting an oxide film obtained by subjecting a valve-acting metal material to electrolytic oxidation with a solution in which metal ion and organic base are dissolved, and to obtain a small-size capacitor having a high capacitance, low ESR and low leakage current using the composite oxide film.

BEST MODE FOR CARRYING OUT THE INVENTION

The capacitor of the present invention comprises a composite oxide film obtained by reaction of an oxide film obtained by subjecting the surface of a substrate comprising valve-acting metal to electrolytic oxidation with a solution in which metal ion and organic base are dissolved.

Valve-acting metal is a metal element which exerts valve action by forming a stable oxide film. Known valve-acting metal elements include aluminum, tantalum, niobium, titanium, hafnium, zirconium, zinc, tungsten, bismuth and antimony. Among these, aluminum, tantalum, titanium and niobium are preferable, and titanium is particularly preferable.

The substrate comprising valve-acting metal element may be a substrate of any kind so long as it contains a valve-acting metal element and include those formed in an elemental substance of valve-acting metal and in the alloy comprising valve-acting metal. The shape of the substrate is not particularly limited as long as it can be subjected to electrolytic oxidation and may preferably have a shape of a board, a foil and a rod. Among these, the foil-shape is particularly preferable. With respect to the substrate in a shape of a foil, the thickness of the foil is preferably 5 to 150 μm. The size of the substrate may vary depending on the use end, but a substrate suitably used has, in terms of a plate-like element unit, a rectangular shape with a width of approximately from 1 to 50 mm and a length of approximately from 1 to 50 mm, more preferably a width of approximately from 2 to 20 mm and a length of approximately from 2 to 20 mm, much more preferably a width of approximately from 2 to 5 mm and a length of approximately from 2 to 6 mm.

The substrate may be a sintered body. A sintered body can be obtained by obtaining a compact via pressure molding of a sintered body or powder comprising valve-acting metal element in a predetermined shape and, for example, by heating the compact to 500 to 2000° C. and thereby sintering it. A part of a metal wire (or a metal foil) mainly comprising valve-acting metal such as tantalum, niobium and aluminum may be embedded into the compact at the time of molding, and by sintering the wire concurrently with the compact, the part of the metal wire (or the metal foil) protruded from the sintered body can be designed as an anode leading wire (hereinafter, the foil as well as the wire is referred to as a leading wire) of the sintered body. Also, the metal wire (or the metal foil) can be connected to the sintered body after sintering by welding or the like to act as an anode leading wire. A wire diameter of such a metal wire is generally 1 mm or less, and the thickness of a metal foil is generally 1 mm or less. Instead of a metal wire, powder comprising a valve-acting metal element may be attached to a foil of valve-acting metal such as aluminum, tantalum and niobium so as to make the sintered body in which a part of the valve-acting metal foil is made to act as an anode leading wire through sintering.

The surface of the substrate may be cleaned by known methods such as etching treatment before electrolytic oxidation, and it is preferable to subject the substrate to treatment preliminarily so as to increase the specific surface area by known methods such as formation of pores.

In electrolytic oxidation, a substrate comprising a valve-acting metal element is chemically treated by immersing a predetermined portion of the substrate in electrolytic solution and applying a predetermined voltage and current density thereto. In order to stabilize the liquid level of the electrolytic solution used for immersion, it is preferable to apply masking material onto a predetermined portion of the substrate when the chemical formation is carried out. Masking material is not limited by materials. As masking material, general heat-resistant resins, preferably heat resistant resins or precursors thereof soluble or swellable in solvents, composition consisting of inorganic fine powder and cellulose resin (see JP-A-H11-80596) can be used. Specific examples of material usable as masking material include polyphenylsulfone (PPS), polyethersulfone (PES), cyanate ester resin, fluororesin (tetrafluoroethylene, tetrafluoroethylene-perfluoroalkylvinylether copolymer), polyimide and derivatives thereof. These materials can be dissolved or dispersed in organic solvent and therefore a solution or dispersion having an arbitrary solid concentration (that is, viscosity) suitable for coating operation can be easily prepared from these materials.

Examples of electrolytic solution include those containing at least one selected from acids and/or salts thereof such as phosphoric acid, sulfuric acid, oxalic acid, boric acid, adipic acid and salts thereof. The concentration of acid and/or salt thereof in the electrolysis solution is within a range of 0.1 to 30% by mass, preferably 1 to 20% by mass. The temperature of the electrolytic solution is generally within a range of 0 to 90° C., preferably 20 to 80° C.

After immersing the substrate in the electrolytic solution, generally, chemical formation is conducted at constant-current and then after reaching a predetermined voltage, chemical formation is conducted at constant voltage. The chemical formation at constant current and at constant voltage is generally carried out under conditions of current density of 0.1 to 1000 mA/cm$^2$, voltage of 2 to 400 V, and time of 1 millisecond to 400 minutes, preferably current density of 1 to 400 mA/cm$^2$, voltage of 5 to 70 V and time of 1 second to 300 minutes.

An oxide film is formed by the electrolytic oxidation. There is not a limit on the thickness of the oxide film as long as a composite oxide film can be formed in the subsequent step. The thickness is preferably in the range from 1 to 4000 nm, more preferably in the range from 5 to 2000 nm.

The oxide film formed in the step of electrolytic oxidation mentioned above is converted to a composite oxide film by reaction with a solution in which metal ion and organic base are dissolved.

Examples of solvents used as solution for dissolving metal ion and organic base include water, an organic solvent such as alcohol and ketone or a mixed solvent thereof. In the present invention, water is preferable.

There is no particular limit on the metal ion to be dissolved in the solution as long as it reacts with valve-acting metal and enables to attain high relative dielectric constant when made as a composite oxide film. Preferred is a metal ion which enables to obtain a ferroelectric film in combination with valve-acting metal. Preferable examples include alkaline earth metal such as calcium, strontium and barium, and lead, and barium is particularly preferable among these.

A metal compound to be dissolved in the above-mentioned solution is preferably water-soluble, and concrete examples include calcium chloride, calcium nitrate, calcium acetate, strontium chloride, strontium nitrate, barium hydroxide, barium chloride, barium nitrate, barium acetate, lead nitrate, and lead acetate. One of these metal compounds may be used alone or two or more kinds of them may be used in mixture at an arbitrary mixing ratio. Further, a compound containing at least one element selected from a group consisting of Sn, Zr, La, Ce, Mg, Bi, Ni, Al, Si, Zn, B, Nb, W, Mn, Fe, Cu and Dy may be added, such that the concentration of the element in the composite oxide film after the reaction can be less than 5 mol %.

There is no particular limitation on the organic base to be added. Preferred is an organic base which can turn into gas at atmospheric pressure or under reduced pressure, through at least one of evaporation, sublimation and/or thermal decomposition at a temperature employed at the drying or sintering step described later or lower than that temperature. Examples thereof include organic base such as TMAH (tetramethylammonium hydroxide), tetraethylammonium hydroxide and choline. It is preferable that the pH of the solution in which metal ion and organic base are dissolved be 11 or more, more preferably 13 or more, particularly preferably 14 or more. With a higher pH value, the composite oxide film can have a higher crystallinity. With the advance of crystallinity, the dielectric constant of the film becomes higher, which is desirable.

The above mentioned organic base can be used as a pH adjuster to control the pH of the solution. If alkaline metal hydroxide (inorganic base) such as lithium hydroxide, sodium hydroxide and potassium hydroxide is added, alkaline metal will remain in the composite oxide film to be obtained, which might deteriorate the characteristics as functional materials such as dielectric materials and piezoelectric materials when the film is completed as a product. Therefore, it is preferable to add organic base such as tetramethylammonium hydroxide.

The thus prepared solution in which metal ion and organic base are dissolved is allowed to contact the oxide film of the above-mentioned valve-acting metal to cause reaction while stirred and retained, generally at a temperature in the range of 40° C. to the boiling point of the solution, preferably 80° C. to the boiling point of the solution, under normal pressure. The reaction time is generally 10 minutes or more, preferably 1 hour or more. This reaction is performed preferably in the absence of an electric field. The conversion to a composite oxide film proceeds smoothly under the reaction conditions in the presence of organic base, even in the absence of an electric field though the mechanism is not clearly known.

After the above reaction, impure ion is removed from the reaction site, if required, using methods such as electrodialysis, ion exchange, washing with water and membrane osmometry, followed by drying. The drying time is generally from one hour to 24 hours at room temperature to 150° C. There is no particular limit on the drying atmosphere, and drying can be carried out at atmospheric pressure or under reduced pressure.

The entire oxide film can be eventually converted to a composite oxide film, but a partial conversion is also allowable.

A composite oxide film is formed according to the above method, and it is preferable to sinter the film to attain further higher relative dielectric constant of the composite oxide film. The sintering conditions of any temperature and time period are allowable so long as the dielectric constant of the composite oxide film becomes higher. The conditions are to be experimentally determined depending on the composite oxide to be sintered and cannot be uniformly defined, but sintering conditions of temperature, time and the like such that the relative dielectric constant increases more than ten times that before sintering are preferable.

Sintering may cause oxygen defect in the composite oxide film depending on the sintering atmosphere and make the sintered film semiconducting. In this case, it is preferable to incorporate a step of annealing the composite oxide film under an acidic atmosphere. Any annealing conditions for time and temperature are acceptable as long as they can make the composite oxide film not semiconducting but insulating. Such conditions are to be individually determined depending on the composite oxide to be annealed and cannot be uniformly defined, but any conditions will be acceptable as long as they enable to reduce the leakage current of the composite oxide film due to oxygen defect to a level suitable for the use as a capacitor. The relative dielectric constant of the composite oxide film constituting the capacitor of the present invention is preferably 80 to 15,000.

The capacitor of the present invention comprises electrodes constituting a capacitor element as well as the above-mentioned composite oxide film. The electrodes are formed of electrode materials generally used for a capacitor. The electrode materials to be used include manganese oxide, electroconductive polymer and metal represented by nickel, silver and copper. Generally, carbon paste is attached onto the composite oxide film formed on the surface of a substrate and further, silver paste is attached thereon to thereby make the composite oxide film conducting to an external lead. In this way, a capacitor comprising a substrate, a composite oxide film and electrodes can be formed. The present invention also includes a structure in which an oxide film is partially converted to a composite oxide film.

The solid electrolytic capacitor of the present invention comprises a substrate comprising a valve-acting metal element, a composite oxide film obtained by a reaction of an oxide film obtained by subjecting the substrate surface to electrolytic oxidation and a solution in which metal ion and organic base are dissolved, a solid electrolyte layer laminated onto the composite oxide film, and a conductor layer laminated on the solid electrolyte layer. The substrate serves as an anode of the capacitor and the solid electrolyte layer and the electroconductive layer serve as a cathode of the capacitor.

Examples of a compound which forms the solid electrolyte layer used in the present invention include electroconductive polymer. The electroconductive polymer includes those containing as a repeating unit a structure represented by a compound having a thiophene skeleton, a compound having a quinoxaline skeleton, a compound having a pyrrole skeleton, a compound having a furan skeleton and a compound having an aniline skeleton. The electroconductive polymer constituting the solid electrolyte layer is not limited thereto.

Examples of the compound having a thiophene skeleton used to obtain the electroconductive polymer include 3-methylthiophene, 3-ethylthiophene, 3-propylthiophene, 3-butylthiophene, 3-pentylthiophene, 3-hexylthiophene, 3-heptylthiophene, 3-octylthiophene, 3-nonylthiophene, 3-decylthiophene, 3-fluorothiophene, 3-chlorothiophene, 3-bromothiophene, 3-cyanothiophene, 3,4-dimethylthiophene, 3,4-diethylthiophene, 3,4-butylenethiophene, 3,4-methylenedioxythiophene, and 3,4-ethylenedioxythiophene and derivatives thereof. These compounds are commercially available or can be prepared by known methods (for example, described in Synthetic Metals, 1986, Vol. 15, Page 169). The present invention is not limited thereto.

Examples of the compound having a thiophene skeleton include those having a ring such as a benzene ring and a naphthalene ring condensed to a thiophene ring. Specific examples include compounds having a 1,3-dihydrobenzo[c]thiophene) skeleton and compounds having a 1,3-dihydronaphtho[2,3-c]thiophene skeleton. Further, examples include compounds having a 1,3-dihydroanthra[2,3-c]thiophene skeleton, and compounds having 1,3-dihydronaphthaceno[2,3-c]thiophene skeleton, derivatives of 1,3-dihydrobenzo[a]anthraceno[7,8-c]thiophene, compounds of having a 1,3-dihydroronaphtho[1,2-c]thiohene skeleton, derivatives of 1-3-dihydrophenanthra[2,3-c]thiophene and compounds having a 1,3-dihydrotriphenylo[2,3-c]thiophene skeleton. These compounds can be prepared by a known method, for example, the method described in JP-A-8-3156.

Examples of the compound having a quinoxaline skeleton include 1,3-dihydrothieno[3,4-b]quinoxaline, 1,3-dihydrothieno[3,4-b]quinoxaline-4-oxide and 1,3-dihydrothieno[3,4-b]quinoxaline-4,9-dioxide.

Examples of the compound having a pyrrole skeleton include derivatives such as 3-methylpyrrole, 3-ethylpyrrole, 3-ipropylpyrrole, 3-butylpyrrole, 3-pentylpyrrole, 3-hexylpyrrole, 3-heptylpyrrole, 3-octylpyrrole, 3-nonylpyrrole, 3-decylpyrrole, 3-fluoropyrrole, 3-chloropyrrole, 3-bromopyrrole, 3-cyanopyrrole, 3,4-dimethylpyrrole, 3,4-diethylpyrrole, 3,4-butylenepyrrole, 3,4-methylenedioxypyrrole and 3,4-ethylenedioxypyrrole, however, the present invention is not limited thereto. These compounds are commercially available or may be prepared by a known method and the present invention is not limited thereto.

Examples of the compound having a furan skeleton include derivatives such as 3-methylfuran, 3-ethylfuran, 3-propylfuran, 3-butylfuran, 3-pentylfuran, 3-hexylfuran, 3-heptylfuran, 3-octylfuran, 3-nonylfuran, 3-decylfuran, 3-fluorofuran, 3-chlorofuran, 3-bromofuran, 3-cyanofuran, 3,4-dimethylfuran, 3,4-diethylfuran, 3,4-butylenefuran, 3,4-methylenedioxyfuran and 3,4-ethylenedioxyfuran, however, the present invention is not limited thereto. These compounds are commercially available or may be prepared by a known method and the present invention is not limited thereto.

Specific examples of the compound having an aniline skeleton include a derivative such as 2-methylaniline, 2-ethylaniline, 2-propylaniline, 2-butylaniline, 2-pentylaniline, 2-hexylaniline, 2-heptylaniline, 2-octylaniline, 2-nonylanilin, 2-decylaniline, 2-fluoroaniline, 2-chloroaniline, 2-bromoaniline, 2-cyanoaniline, 2,5-dimethylaniline, 2,5-diethylaniline, 3,4-butyleneaniline, 3,4-methylenedioxyaniline and 3,4-ethylenedioxyaniline. Such a compound may be a commercially available product or may be prepared by a known method and the present invention is not limited thereto.

Compounds selected from the group of the above-mentioned compounds may be used in combination as a multi-component copolymer. The relative proportions of the polymerizable monomers and the like depend on polymerization conditions, and preferable proportions and polymerization conditions can be confirmed by a simple experiment.

The electroconductive polymer can be obtained by chemical oxidative polymerization or electrolytic oxidative polymerization. The preferred oxidant used in the oxidative polymerization is a compound relatively inexpensive from industrial viewpoint and easy to handle in the production process. Examples include Fe(III) compounds such as $FeCl_3$, $FeClO_4$ and Fe(organic acid anion) salt; anhydrous aluminium chloride/cuprous chloride, alkali metal persulfates, ammonium persulfates, peroxides, manganese compounds such as potassium permaganate, quinones such as 2,3-dichloro-5,6-dicyano-1,4-benzoquinone(DDQ), tetrachloro-1,4-benzoquinone and tetracyano-1,4-benzoquinone, halogens such as iodine and bromine, peracid, sulfuric acid, fuming sulfuric acid, sulfur trioxide, chloro sulfuric acid, fluorosulfuric acid and amidosulfonic acid, sulfone acid and ozone. These oxidants may be used singly or in a combination of two or more thereof.

Among these, examples of basic compound of an organic acid anion forming the Fe (organic acid anion) salt include organic sulfonic acid or organic carboxylic acid, organic phosphoric acid and organic boric acid, and polymer electrolyte anions. Examples of organic sulfonic acid include benzenesulfonic acid, p-toluene sulfonic acid, methanesulfonic acid, ethanesulfonic acid, α-sulfo-naphthalene, β-sulfo-naphthalene, naphthalene disulfonic acid, and alkyl naphthalene sulfonic acid (including as alkyl groups, butyl, triisopropyl, di-t-butyl and the like). Examples of organic carboxylic acid usable here include acetic acid, propionic acid, benzoic acid and oxalic acid. Further, examples of polymer electrolyte anions include polyacrylic acid, polymethacrylic acid, polystyrene sulfonic acid, polyvinyl sulfonic acid, polyvinyl sulfuric acid, poly-α-methylsulfonic acid, polyethylene sulfonic acid and polyphosphoric acid. The organic acid anion is not limited thereto.

Examples of the counter cations of the above anions include $H^+$, alkali metal ions such as $Na^+$ and $K^+$, or ammonium ions substituted with tetramethyl group, tetraethyl group, tetrabutyl group, tetraphenyl group or the like. In the present invention, there is no particular limitation on the cations.

Among the above oxidants, those containing trivalent Fe compounds, cuprous chloride compounds, alkali persulfates, ammonium persulfates, manganese acids or quinones are particularly suitable in the present invention.

A counter anion having dopant ability may coexist in the solid electrolyte layer used in the present invention. Examples of the counter anion having dopant ability include electrolytic compounds having oxidant anions (reductant of oxidant) generated from above-described oxidants as counter anions and other anion-based electrolytes. Specific examples include protonic acid anions such as halogenated anions of 5B-Group elements such as $PF_6^-$, $SbF_6^-$ and $AsF_6^-$, halogenated anions of 3B-Group elements such as $BF_4^-$, halogen anions such as $I^-$ ($I_3^-$), $Br^-$ and $Cl^-$, halogen acid anions such as $ClO_4^-$, Lewis acid anions such as $AlCl_4^-$, $FeCl_4^-$ and $SnCl_5^-$, Inorganic acid anions such as $NO_3^-$ and $SO_4^{2-}$, organic sulfonic acid anions such as p-toluene sulfonic acid, naphthalene sulfonic acid, alkyl-substituted sulfonic acid having 1 to 5 carbon atoms, $CH_3SO_3^-$ and $CF_3SO_3^-$, and such as carboxylic acid anions such as $CF_3COO^-$ and $C_6H_5COO^-$. Further, examples include polymer electrolyte anions of polyacrylic acid, polymethacrylic acid, polystyrene sulfonic acid, polyvinyl sulfonic acid, polyvinyl sulfuric acid, poly-α-methyl sulfonic acid, polyethylene sulfonic acid and polyphosphoric acid. However, the present invention is not limited thereto.

Among these counter anion having dopant ability, high-molecular-weight or low-molecular-weight organic sulfonic acid or polyphosphoric acid are preferable, and aryl sulfonate dopant is particularly preferable. Examples of the aryl sulfonate dopant include salt of benzenesulfonic acid, toluenesulfonic acid, naphthalenesulfonic acid, anthracenesulfonic acid, anthraquinonesulfonic acid or derivatives of these compounds.

The concentration of monomer forming an electroconductive polymer varies depending on the kinds of substituents of the compounds to be used as monomer, solvent and the like. Generally, it is preferable that the concentration be within a range of $10^{-3}$ to 10 mol/L, more preferably from $10^{-2}$ to 5 mol/L. The reaction temperature is determined according to reaction method and cannot be flatly defined. Generally, the temperature is selected from the range of −70 to 250° C., preferably −30 to 150° C., more preferably −10 to 30° C.

Any reaction solvent can be used for producing the electroconductive polymer as long as the solvent can dissolve monomer, oxidant and counter anion having dopant ability together or separately. Examples thereof include ethers such as tetrahydrofuran, dioxane and diethylether; polar aprotic solvents such as dimethylformamide, acetonitrile, benzonitrile, N-methylpyrrolidone and dimethylsulfoxide; esters such as ethyl acetate and butyl acetate; non-aromatic chlorine-based solvents such as chloroform and methylene chloride; nitro compounds such as nitromethane, nitroethane and nitrobenzene; alcohols such as methanol, ethanol and propanol; organic acids such as formic acid, acetic acid and propionic acid; acid anhydrides of these organic acids (such as acetic anhydride), ketones and water; and mixtures of these solvents may also be used.

In the production of the electroconductive polymer, the monomer, oxidant and/or counter anion having dopant ability may be dissolved together in a reaction solution to be used as a single solution; or may be used in two solutions, i.e. one dissolving oxidant and/or counter anion having dopant ability and the other dissolving monomer; or may be used in three solutions each dissolving oxidant, counter anion having dopant ability and monomer separately. By applying these solvents on the composite oxide film and thereby to subject the film to oxidative polymerization, a solid electrolyte layer can be formed on the composite oxide film. The conductivity of the solid electrolyte layer to be used in the present invention is preferably 1 S/cm or more, more preferably 5 S/cm or more, particularly preferably 10 S/cm or more.

The conductor layer to be laminated on the solid electrolyte layer is not particularly limited so long as it can be used as an electrode of a capacitor. Examples thereof include those comprising a thin metal film obtained by a physical film formation such as vapor deposition and sputtering or by applying pastes such as metal-containing pastes. The conductor layer may comprise a carbon paste layer and an electroconductive layer containing metal powder. The electroconductive layer containing metal powder adheres to the solid electrolyte layer through a carbon paste layer to thereby serve as a cathode of a capacitor as well as a bonding layer to connect with the cathode lead terminal in end products of the capacitor. The thickness of the metal-containing electroconductive layer is not limited but generally is about 1 to 100 μm, preferably 5 to 50 μm.

A solid electrolytic capacitor is obtained by providing or connecting a lead frame (lead terminal) by known methods on each electrode of the capacitor element obtained in the way as described above, and then sealing the whole with an insulating resin such as epoxy resin. There are no particular limitations on materials for lead frame as long as the material is widely used one. Preferred examples thereof include copper-base (such as Cu—Ni base, Cu—Ag base, Cu—Sn base, Cu—Fe base, Cu—Ni—Ag base, Cu—Ni—Sn base, Cu—Co—P base, Cu—Zn—Mg base and Cu—Sn—Ni—P base alloys) materials and materials having on the surface copper-base plating, in consideration for obtaining good efficiency in chamfering corners of the lead frame.

The capacitor of the present invention can be used for electronic components and electronic devices. By embedding the capacitor in a printed circuit board, i.e. implementing a multilayer board such as a subcomposite with the function of the capacitor element, a high-density multifunctional circuit board can be obtained. Since the capacitor of the present invention has properties of low ESR and low leakage current, it can meet the demands of speed-up and high integration of an IC chip and the like.

EXAMPLES

Hereinafter, the present invention will be explained in more detail referring to examples. It should be noted that these examples are merely exemplary and the present invention should not be construed as being limited thereto.

Example 1

A titanium foil (product of THANK-METAL Co., Ltd.) with purity of 99.9% having a thickness of 20 μm, having been prepared to be 3.3 mm in width, was cut into 13 mm-long rectangular pieces. One short side of each of the titanium foil pieces was fixed to a metal guide by welding. A 0.8 mm-wide line was formed with a solution of polyimide resin (product of UBE INDUSTRIES. LTD.) on a position 7 mm from the unfixed end of the foil, and dried at approximately 180° C. for 30 minutes to thereby mask the portion.

The portion of the titanium foil from the unfixed end to the above masked portion was immersed in 5% by mass phosphoric acid aqueous solution and electrolytic oxidation treatment was conducted by applying a voltage of 15 V with electric current density of 30 $mA/cm^2$ at 40° C. for 120 minutes, followed by pulling it up out of the phosphoric acid aqueous solution, washing with water and drying, to thereby form a titanium oxide layer on the surface of the titanium foil.

Next, a solution was prepared by dissolving barium hydroxide in 20% tetramethylammonium hydroxide aqueous solution until it reaches to 20 mM. The pH of the solution was 14. The titanium foil having the titanium oxide layer formed thereon was immersed in this solution at 125° C. for four hours to thereby cause reaction to convert titanium oxide to barium titanate (a composite oxide). The barium titanate film had a thickness of 38 nm and relative dielectric constant of 330.

The foil subjected to the above treatment was washed with water and dried, and after forming 0.8 mm-wide line with a solution of polyimide resin centering on a position 5 mm from the end of the foil, dried at 180° C. for one hour to thereby mask the portion.

5 μl of aqueous dispersion of 3,4-ethylenedioxythiophene polymer containing polystyrene sulfonic acid as a dopant was delivered dropwise onto one side of the portion 4.6 mm from the end of the foil (cathode part: 3.5 mm in width×4.6 mm in length) and spread all over the cathode part and naturally dried for one hour and then dried at 125° C. for 30 minutes to thereby form a solid electrolyte layer. A carbon paste and a silver paste were sequentially applied on the solid electrolyte layer to thereby complete a capacitor element.

The obtained capacitor element was placed on a lead frame and the solid electrolyte part of the capacitor element was welded to the cathode lead terminal with Ag paste, the part exposing the titanium foil of the capacitor element was welded to the anode lead terminal, and the whole of the capacitor element and the lead frame were encapsulated with epoxy resin to thereby produce 30 units of capacitor chips.

With respect to these 30 units of the capacitors, the capacitance and loss factor (tan δ×100(%)) at 120 Hz, the equivalent series resistance (ESR) at 100 kHz and the leakage current were measured as initial properties. The leakage current was measured one minute after voltage of 2V was applied. The measurement results are as follows:

| | |
|---|---|
| Capacitance (average value): | 2.5 μF |
| tan δ (average value): | 5.0% |
| ESR (average value): | 20 mΩ |
| Leakage current (average value): | 50 μA |

Example 2

A titanium foil (product of THANK-METAL Co., Ltd.) with purity of 99.9% having a thickness of 20 μm, having been prepared to be 3.3 mm in width, was cut into 13 mm-long rectangular pieces. One short side of each of the titanium foil pieces was fixed to a metal guide by welding. A 0.8 mm-wide line was formed with a solution of polyimide resin (product of UBE INDUSTRIES. LTD.) on a position 7 mm from the unfixed end of the foil, and dried at approximately 180° C. for 30 minutes to thereby mask the portion.

The portion of the titanium foil from the unfixed end to the above masked portion was immersed in 5% by mass phosphoric acid aqueous solution and electrolytic oxidation treatment was conducted in stages by applying a voltage of 15 V with electric current density of 30 mA/cm² at 40° C. for 120 minutes, followed by pulling it up out of the phosphoric acid aqueous solution, washing with water and drying, to thereby form a titanium oxide layer on the surface of the titanium foil.

Next, a solution was prepared by dissolving barium hydroxide in 20% tetramethylammonium hydroxide aqueous solution until it reaches to 20 mM. The pH of the solution was 14. The titanium foil having the titanium oxide layer formed thereon was immersed in this solution at 125° C. for four hours to thereby cause reaction to convert titanium oxide to barium titanate. The barium titanate film had a thickness of 38 nm and relative dielectric constant of 12000. The foil was washed with water, dried, and sintered at 800° C. in vacuum and further annealed at 300° C. in the atmosphere for two hours.

After a 0.8 mm-wide line with a solution of polyimide resin was formed centering on a position 5 mm from the end of the foil subjected to the above treatment, the foil was dried at 180° C. for one hour to thereby mask the portion.

5 μl of aqueous dispersion of 3,4-ethylenedioxythiophene polymer containing polystyrene sulfonic acid as a dopant was delivered dropwise onto one side of the portion 4.6 mm from the end of the foil (cathode part: 3.5 mm in width×4.6 mm in length) and spread all over the cathode part and naturally dried for one hour and then dried at 125° C. for 30 minutes to thereby form a solid electrolyte layer. A carbon paste and a silver paste were sequentially applied on the solid electrolyte layer to thereby complete a capacitor element.

The obtained capacitor element was placed on a lead frame and the solid electrolyte part of the capacitor element was welded to the cathode lead terminal with Ag paste, the part exposing the titanium foil of the capacitor element was welded to the anode lead terminal, and the whole of the capacitor element and the lead frame were encapsulated with epoxy resin to thereby produce 30 units of capacitor chips.

With respect to these 30 units of the capacitors, the capacitance and loss factor (tan δ×100(%)) at 120 Hz, the equivalent series resistance (ESR) at 100 kHz and the leakage current were measured as initial properties. The leakage current was measured one minute after voltage of 2V was applied. The measurement results are as follows:

| | |
|---|---|
| Capacitance (average value): | 87 μF |
| tan δ (average value): | 5.8% |
| ESR (average value): | 13 mΩ |
| Leakage current (average value): | 200 μA |

Comparative Example 1

A titanium foil (product of THANK-METAL Co., Ltd.) with purity of 99.9% having a thickness of 20 μm, having been prepared to be 3.3 mm in width, was cut into 13 mm-long rectangular pieces. On a 3.3 mm by 4.6 mm portion of the foil which acts as a cathode part, a 1 μm-thick barium titanate film was formed by sputtering. The relative dielectric constant of the barium titanate film was 220. 5 μl of aqueous dispersion of 3,4-ethylenedioxythiophene polymer containing polystyrene sulfonic acid as a dopant was delivered dropwise onto the film and spread all over the cathode part and naturally dried for one hour and then dried at 125° C. for 30 minutes to thereby form a solid electrolyte layer. A carbon paste and a silver paste were sequentially applied on the solid electrolyte layer to thereby complete a capacitor element.

The obtained capacitor element was placed on a lead frame and the solid electrolyte part of the capacitor element was welded to the cathode lead terminal with Ag paste, the part exposing the titanium foil of the capacitor element was welded to the anode lead terminal, and the whole of the capacitor element and the lead frame were encapsulated with epoxy resin to thereby produce 30 units of capacitor chips.

With respect to these 30 units of the capacitors, the capacitance and loss factor (tan δ×100(%)) at 120 Hz, the equivalent series resistance (ESR) at 100 kHz and the leakage current were measured as initial properties. The leakage current was measured one minute after voltage of 2V was applied. The measurement results are as follows:

| | |
|---|---|
| Capacitance (average value): | 0.03 μF |
| tan δ (average value): | 15% |
| ESR (average value): | 60 mΩ |
| Leakage current (average value): | 400 μA |

The invention claimed is:

1. A capacitor comprising a composite oxide film obtained by reaction of an oxide film obtained by subjecting the surface of the substrate comprising valve-acting metal element to electrolytic oxidation with a solution in which metal ion and an organic base are dissolved.

2. A capacitor comprising a composite oxide film obtained by reaction of an oxide film obtained by subjecting the surface of the substrate comprising valve-acting metal element to electrolytic oxidation with a solution in which metal ion and an organic base are dissolved and by subsequently sintering the reactant.

3. A solid electrolytic capacitor comprising:
a substrate comprising a valve-acting metal element;
a composite oxide film obtained by reaction of an oxide film obtained by subjecting the surface of the substrate comprising valve-acting metal element to electrolytic oxidation with a solution in which metal ion and an organic base are dissolved;
a solid electrolyte layer laminated on the composite oxide film; and
a conductor layer laminated on the solid electrolyte layer.

4. The capacitor as claimed in any one of claims 1 to 3, wherein the reaction of the oxide film and the solution in which metal ion and organic base are dissolved uses a chemical reaction performed in the absence of an electric field.

5. The capacitor as claimed in any one of claims 1 to 3, wherein the pH of the solution wherein metal ion and organic base are dissolved is 11 or more.

6. The capacitor as claimed in any one of claims 1 to 3, wherein the relative dielectric constant of the composite oxide film is 80 to 15,000.

7. The capacitor as claimed in any one of claims 1 to 3, wherein the thickness of the composite oxide film is 1 nm to 4000 nm.

8. The capacitor as claimed in any one of claims 1 to 3, wherein the valve-acting metal element is titanium.

9. The capacitor as claimed in any one of claims 1 to 3, wherein the metal ion is barium ion.

10. An electronic component comprising the capacitor as claimed in any one of claims 1 to 3.

11. A printed circuit comprising the capacitor as claimed in any one of claims 1 to 3.

12. A consumer electronic device comprising the capacitor as claimed in any one of claims 1 to 3.

13. A method for producing a capacitor comprising at least a step of forming an oxide film by electrolytic oxidation of a valve-acting metal element and a step of reacting the oxide film with metal ion dissolved in an organic solvent.

14. A method for producing a capacitor comprising at least a step of forming an oxide film by electrolytic oxidation of a valve-acting metal element, a step of reacting the oxide film with a solution in which metal ion and organic base are dissolved and a step of sintering the reactant.

15. A method for producing a capacitor comprising at least a step of forming an oxide film by electrolytic oxidation of a valve-acting metal element, a step of reacting the oxide film with a solution in which metal ion and organic base are dissolved, a step of laminating a solid electrolyte layer on the composite oxide film and a step of laminating a conductor layer on the solid electrolyte layer.

* * * * *